United States Patent [19]

Adam et al.

[11] Patent Number: 5,017,896

[45] Date of Patent: May 21, 1991

[54] MODE TRAPPED MAGNETOSTATIC WAVE (MSW) FILTERS AND CHANNELIZER FORMED THEREFROM

[75] Inventors: John D. Adam, Murrysville; Salvador H. Talisa, Edgewood, both of Pa.

[73] Assignee: Westinghouse Electric Corp., Pittsburgh, Pa.

[21] Appl. No.: 466,146

[22] Filed: Jan. 16, 1990

[51] Int. Cl.$^5$ .................... H01P 1/213; H01P 1/215; H01P 1/19

[52] U.S. Cl. .................... 333/134; 333/202; 333/219.2; 333/156

[58] Field of Search .................... 333/219, 219.2, 202, 333/201, 186, 141, 143, 147–149, 24.2, 134, 156

[56] References Cited

U.S. PATENT DOCUMENTS

| | | | |
|---|---|---|---|
| 4,316,162 | 2/1982 | Volluet et al. | 333/201 |
| 4,395,686 | 7/1983 | Adam | 333/151 |
| 4,528,529 | 7/1985 | Haijer | 333/219 |
| 4,571,562 | 2/1986 | Castéra | 333/147 X |
| 4,614,923 | 9/1986 | Roveda et al. | 333/141 X |

OTHER PUBLICATIONS

Adam, Annual Frequency Control Symposium 1982; "Magnetostatic Wave Multi-channel Filter".
Murakami et al., 1985 IEEE MIT-S Digest; (K41; pp. 285–288).
Adam, 1985 IEEE Ultrasonics Symposium; pp. 157–162.
Adam, IEEE Transactions on Magnetics, 1987; pp. 3742–3744.
Takeda, 1987 IEEE Transactions on Magnetics; pp. 3340–3342.
Murakami et al., 1987 IEEE MIT-S Digest; (513) pp. 371–374.
Adam et al., 1988 IEEE MIT-S Digest; (FF4); pp. 879–882.

Primary Examiner—Eugene R. LaRoche
Assistant Examiner—Benny Lee
Attorney, Agent, or Firm—John K. Williamson

[57] ABSTRACT

In the present invention magnetostatic wave (MSW) filters of the delay line and resonator type responsive to multimode MSW signals trap a desired MSW mode of the signal and attenuate untrapped modes of the signal in order to provide a higher order band rejection characteristic. In a preferred embodiment a low loss YIG film is disposed on a substrate. An apertured metallization layer on the YIG film defines a region of MSW propagation within the aperture and a metallization layer at the opposite side of the YIG film traps a selected MSW mode in said aperture. A region of high attenuation for MSW waves adjacent the desired propagation region absorbs untrapped MSW waves.

21 Claims, 5 Drawing Sheets

MODE TRAPPED MAGNETOSTATIC WAVE (MSW) FILTERS AND CHANNELIZER FORMED THEREFROM

BACKGROUND OF THE INVENTION

1. Field of the Invention

This invention relates to magnetostatic wave (MSW) filters and, in particular, the invention relates to an MSW filter in which a desired propagation mode is trapped for propagation in the MSW filter medium with a relatively low attenuation and undesired modes are sharply attenuated.

2. Description of Related Art:

In magnetostatic wave devices energy in the form of magnetic waves is carried through the bulk of a suitable MSW medium, for example, a ferrite material such as yttrium iron garnet (YIG). Typically, an input transducer such as a conductive microwave stripline carries an RF electromagnetic current or signal which, when magnetically coupled to the ferrite is converted to an MSW which propagates therein. The MSW may be reconverted to RF by means of an output transducer suitably coupled to the ferrite at a location along the axis of MSW propagation in the medium remote and isolated from the input transducer. Ferrite boundaries and metallization boundaries cause MSW reflections in the ferrite. When properly sized the boundaries form resonators and delay lines. In the delay line, for example, the MSW propagates from the input transducer to the output transducer. By appropriately biasing the medium with a magnetic field the boundaries, the transducer geometry and the field define a frequency selectivity in such a MSW delay line. Typically, because the dimensional boundaries of the delay line form a MSW waveguide capable of supporting many modes, input signals outside the desired passband of the lower order MSW mode can excite higher order modes which, if not attenuated, can travel to the output transducer and produce undesired responses within the filter stop band. Similarly, a resonator which may be a YIG medium having square boundaries causes the base frequency to resonate within the boundaries. However, higher order modes or harmonics of the wavelength of the base frequency also appear in the resonator output. While various techniques are known for varying the bandpass shape of the delay line or the resonator including carefully tailoring of the strip line and boundaries, harmonics or extraneous undesirable modes may be propagated in such devices thereby creating out-of-band responses which seriously degrade the filter performance.

Bandpass filters and filter banks based on MSW resonators and delay lines are attractive as preselectors in radar and communication systems and in channelized receivers. However, both the resonator and delay-line based filters require that undesired out-of-band responses due to higher order MSW modes be suppressed. This has been achieved in the delay line filter by the use of resistive aluminum strips, by tapering the width of the YIG film, or by the use of a lossy second layer of YIG which is coupled to the low loss YIG. In resonators, higher order modes have been suppressed by etching an annular ring in the YIG film. None of these techniques are sufficient to achieve an out-of-band rejection greater than about 60 dB, as required in high dynamic range systems. Moreover, the mode suppression approaches of delay line filters introduce undesirable excess loss.

The most troublesome responses are due to MSW width modes which are higher order MSW cavity type resonances and are defined by the edges of the YIG film.

SUMMARY OF THE INVENTION

In the present invention a magnetostatic wave (MSW) filter responsive to broad band microwave signals includes a trap for a desired MSW mode excited by the signal and an attenuator for undesired modes excited by the signal. In a preferred embodiment the MSW filter of the present invention a magnetostatic wave propagation medium such as a low loss YIG film has an apertured metallization layer on one side of the YIG film for defining a desired propagation region of MSWs within the aperture. A metallization layer at the opposite side of the YIG film forms a trap for a selected MSW mode in said aperture. A region of high attenuation for MSWs adjacent the desired propagation region absorbs untrapped modes.

DESCRIPTION OF THE PREFERRED EMBODIMENT

In accordance with the present invention magnetostatic wave (MSW) resonators and narrow band delay line filters are disclosed in which the desired lowest order mode is trapped and higher order modes are untrapped. The resonator is surrounded by a region of high MSW loss so that the untrapped modes are attenuated but the trapped modes in the resonator are unaffected. Similarly, the same principle may be applied to narrow band delay lines.

The MSW mode trapping described in the present invention is due to the effects of adjacent conducting ground planes on the low frequency cut-off of magnetostatic forward volume waves. Two possible structures are shown in FIGS. 1 and 2 with the untrapped and trapped mode field variations shown in corresponding FIG. 3 respectively.

Figure 1:
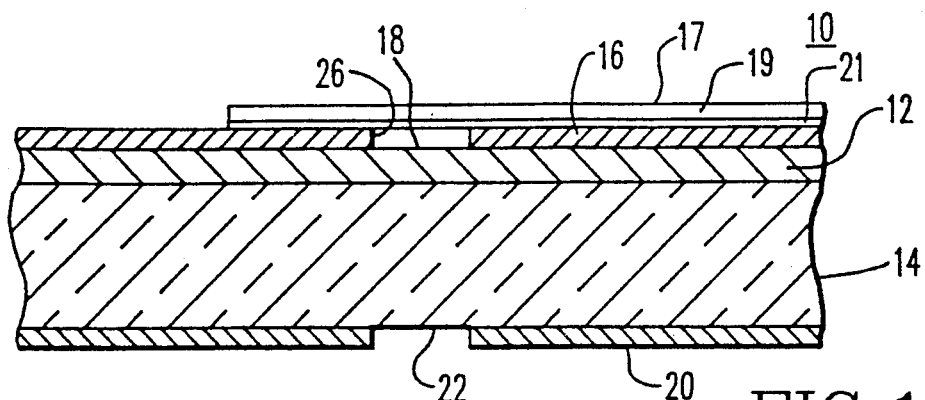
FIG. 1 is a side sectional schematic diagram of a MSW resonator in accordance with the present invention.

FIG. 1 illustrates a MSW filter 10 in which an MSW medium such as a ferrite film 12 formed of a yttrium iron garnet (YIG) is supported by a substrate 14. A transducer 17 is formed on a first apertured ground plane 16. In the embodiment shown, transducer 17 comprises a metal electrode 19 and insulated from ground plane 16 by insulating layer 21. The substrate 14 may be formed of a gallium gadolinium garnet (GGG) material. The ground plane 16 is deposited on one surface of the YIG film 12 and is formed with an aperture 26 therein. An unmetallized area 18 in the ground plane 16 defines a zone of propagation for MSW waves carried by the YIG or ferrite film 12. A second apertured ground plane 20 configured in a manner similar to the first ground plane 16 is deposited on the opposite surface of the substrate 14. The unmetallized area 22 in the second ground plane 20 corresponds to the area of propagation of the YIG film 12.

Figure 2:
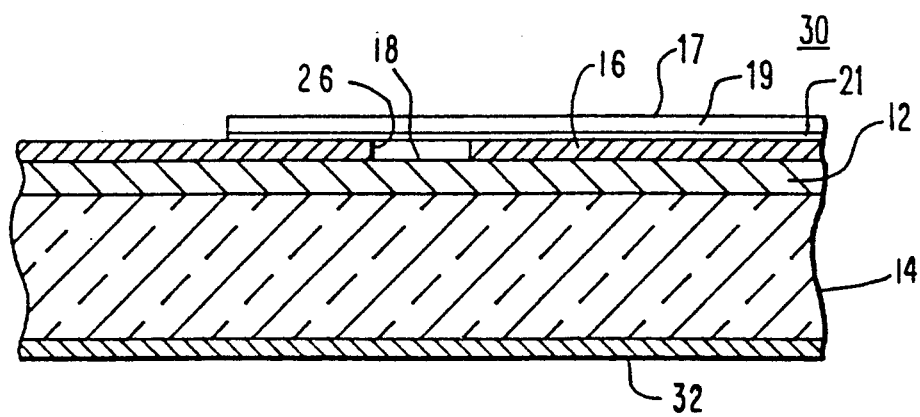
FIG. 2 is a side sectional schematic diagram of a MSW resonator in accordance with another embodiment of the present invention.

In FIG. 2 a MSW filter 30 is illustrated in which the YIG film 12 is deposited on the GGG substrate 14. The first ground plane 16, input transducer 17 and unmetallized propagation region 18 are similar to the arrangement of FIG. 1. In FIG. 2, however, the second ground plane 32 is fully metallized including the area immediately confronting the unmetallized area 18 in the aperture 26 first ground plane 16.

Figure 3:
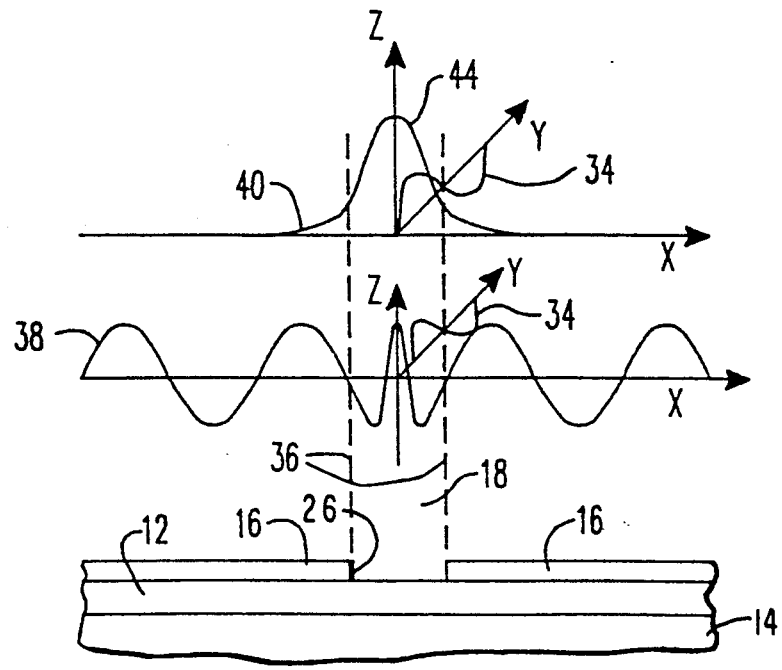
FIG. 3 is a diagram illustrating various MSW modes in trapped and untrapped configurations.

In each case as illustrated in FIG. 3, a magnetostatic wave (MSW) 34 propagates in the YIG medium 12 in the Y direction, namely into the page. The dotted lines 36 represent the boundaries of the aperture 26 in the ground plane 16 in each embodiment. The high wave number MSW wave 38 propagates throughout the YIG film 12 in the X direction. The wavelength of the MSW wave 38 changes as it moves from the portion of the medium 12 directly below the first ground plane 16 to the open or unmetallized area 18.

The boundaries 36 of the slot 18 in the ground plane 16 trap a single mode 44 of the MSW wave 40 therein as shown. The trapped wave 44 propagates only in the unmetallized area 18 in the Y direction. The untrapped wave 38 propagates throughout the YIG film 12.

First or upper ground plane 16 has little or no effect on the low frequency cut-off ($\omega_l$) of forward volume wave propagation, where $\omega_l = \gamma H$ and $\gamma$ is the gyromagnetic ratio (2.8 MHz/Oe) and H is the internal magnetic bias field. The second or lower ground plane 20, however, increases the lower cut-off frequency $\omega_a$ as it comes closer to the YIG layer 12. In the limit, when the YIG 12 is sandwiched between two ground planes, the low frequency cut-off $\omega_l$ is the same as the high frequency cut-off, i.e. $\omega_l \rightarrow \omega_h$.

Figure 4:
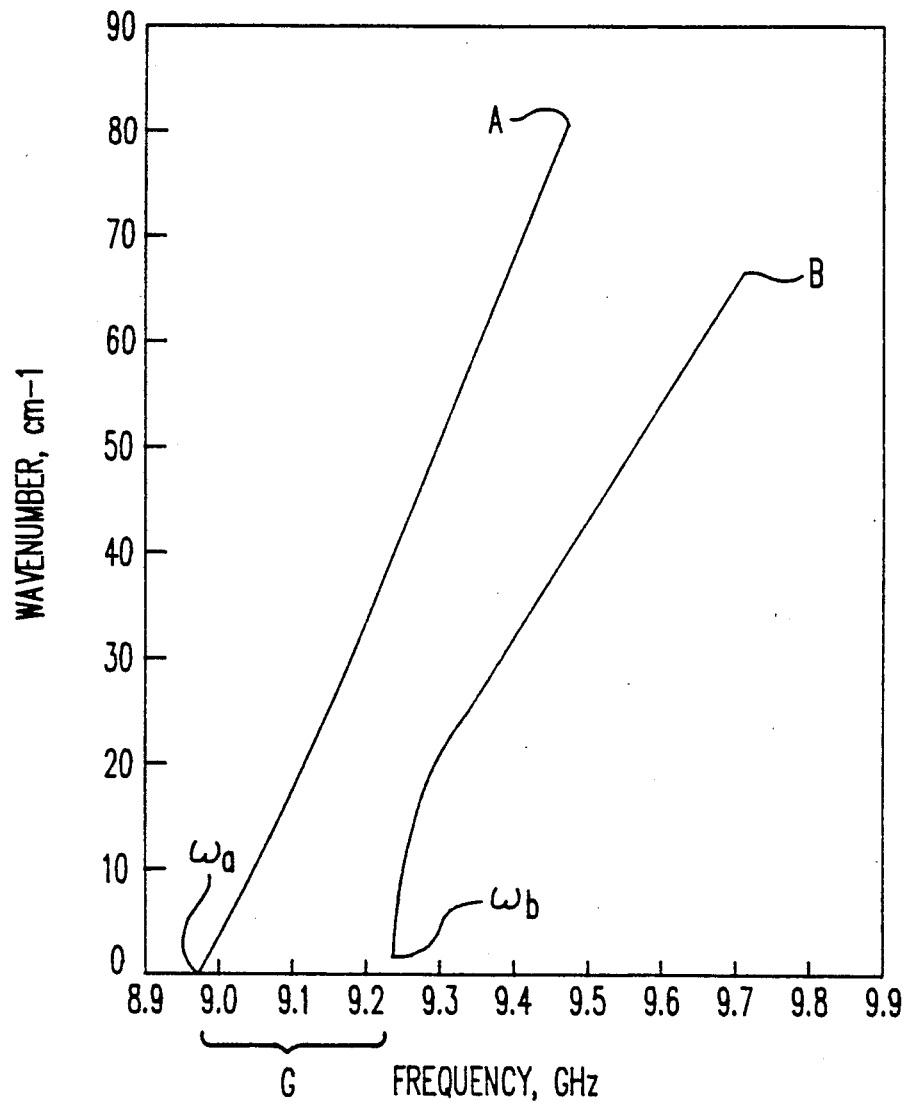
FIG. 4 is a plot of the variation of MSW wavenumber with frequency with (A) a metal film 500 $\mu$m from the YIG film and (B) a second metal film in contact with the YIG film surface.

FIG. 4 shows a plot of wavenumber k as a function of frequency. Curve A represents the curve for a 60 $\mu$m thick YIG film with one ground plane spaced 500 $\mu$m from the YIG film. Curve B represents a trapped mode arrangement with two ground planes such as shown in FIGS. 1 and 2. One of the two ground planes is in contact with one surface of the YIG film and the other is spaced 500 $\mu$m from the YIG film. It can be appreciated from FIG. 4 that the low frequency cut-off $\omega_b$ of curve B is 250 MHz higher than the low frequency cut-off $\omega_a$ shown for curve A. Accordingly, signals within this 250 MHz range or gap G can propagate in the YIG film 12 with only one ground plane but would be evanescent in the film with two ground planes. In other words, low wavenumber signals within gap G tend to propagate in a region with only one ground plane and are thus trapped in the region. While signals above $\omega_b$ can propagate in a region of two ground planes and are thus not trapped. Signals above $\omega_b$ are handled by an attenuation mechanism hereafter described.

Figure 5A:
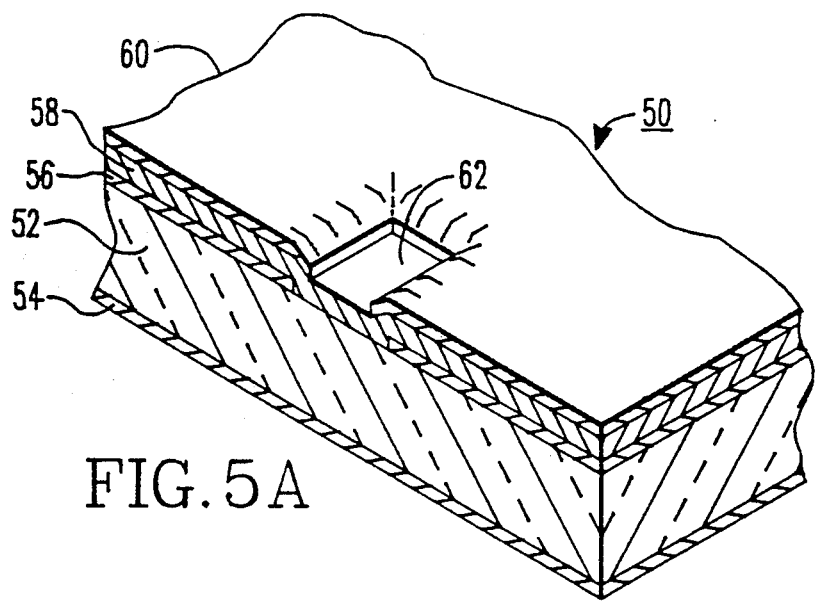
FIGS. 5A–5F are fragmentary side sectional schematic illustrations of various MSW devices incorporating the teachings of the present inVention.

The following examples in FIGS. 5A–5E illustrate trapped resonator configurations. FIG. 5F illustrates a trapped delay line arrangement. The arrangements of FIGS. 5A–5F rely on trapping of the desired resonance in the unmetallized YIG film area and thereafter absorbing the untrapped waves by a variety of techniques in the surrounding metallized area. For example, FIG. 5A illustrates a resonator 50 comprising a GGG substrate 52, lower ground plane 54, a first lossy YIG film 56 on the substrate 52, a low loss YIG film 58 deposited over the film 56 and an apertured upper ground plane 60. A square unmetallized area 62 forms the aperture in the ground plane 60 exposing a portion of the low loss YIG film 58. The high loss YIG film 56 does not extend into the region of the aperture. In FIG. 5A if the width of the unmetallized area 62 is 1 mm, then the lowest order resonance with $K = 10\pi$ cm$^{-1}$ is trapped in the square unmetallized area 62, and thus propagates or resonates only in the aperture 62. Second and higher order resonances at $K = 20\pi$ cm$^{-1}$ (and higher) are untrapped and propagate throughout the low loss YIG film 58. However, the untrapped modes are attenuated by the lossy YIG film 56. This film can be an Ho:YIG which has a resonance line width of >10 Oe and may be deposited by a liquid phase epitaxy or sputtering and patterned by photolithography and etching before growth of the low loss YIG layer 58 thereon.

Figure 5B:
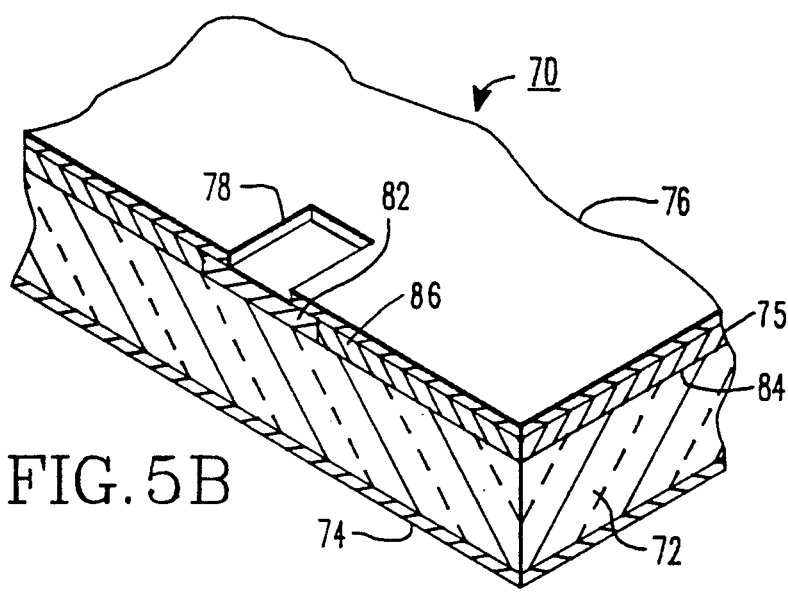

In resonator 70 of FIG. 5B, GGG substrate 72 supports lower ground plane 74 and apertured upper ground plane 76 with a 1 mm aperture 78. A two part YIG film 78 on the substrate 72 has a low loss area 82 in the aperture 78 and high loss area 86 below the ground plane 76. When the lowest order width mode for the aperture 78, namely $K = 10\pi$ cm$^{-1}$ is trapped, high order width modes are untrapped and thus are selectively attentuated in the high loss portion 84 of the film. The MSW loss in the high loss portion of the YIG film 78 surrounding the unmetallized aperture 78 is increased by abrasion, for example, sandblasting, ion-implantation, impurity diffusion, etc.

Figure 5C:
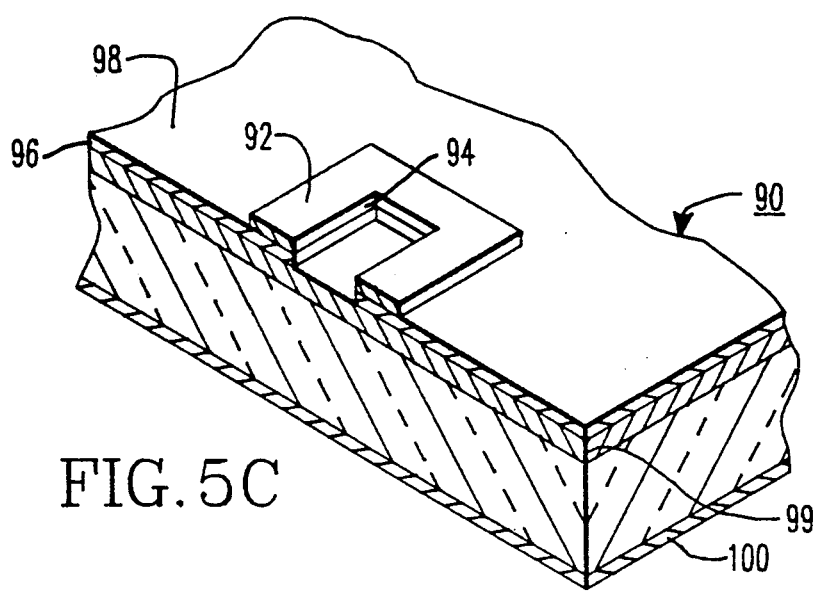

In FIG. 5C resonator 90 is formed by a square ring 92 of thick, high conductivity metal, for example, gold surrounding aperture 94 in the relatively thin lossy ground plane 96. Untrapped waves are attenuated by thin high resistivity film area 98 of the ground plane 96, for example, chrome which surrounds the thick film 92. In this arrangement high order modes which exist in the YIG film 99 between the respective upper and lower ground planes 96, 100 convert a portion of the energy to RF current in the thin film area 98 which dissipates it. The lower order modes trapped in the aperture 94 are unaffected by the lossy ground plane 96.

Figure 5D:
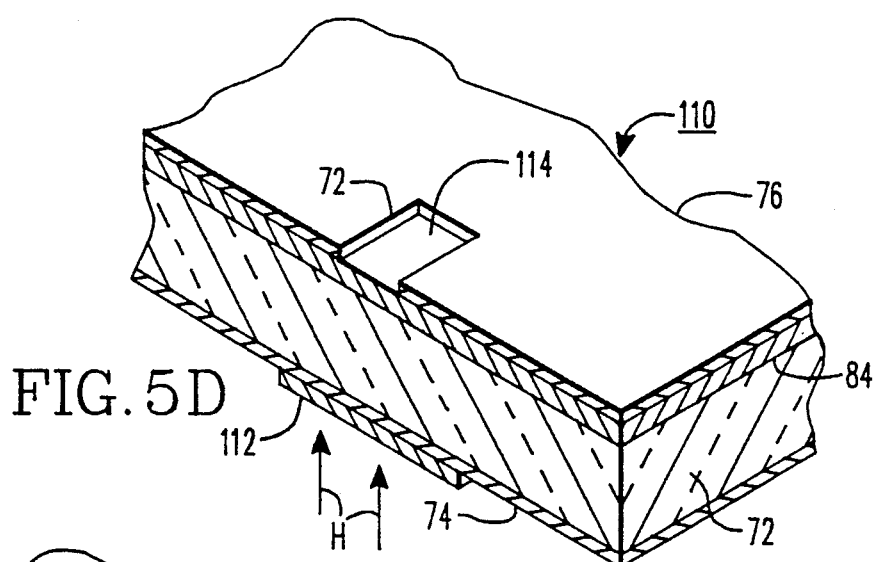

In FIG. 5D untrapped waves in the resonator 110 are attenuated by controlling the magnetic bias field H with a soft iron pole piece 112 so that the magnetic bias field is uniform under the unmetallized area or aperture 114 but falls rapidly outside this region. At a fixed frequency, the MSW wavenumber increases and the group velocity decreases with decreasing magnetic field so that the MSW loss is increased outside the aperture 114.

Figure 5E:
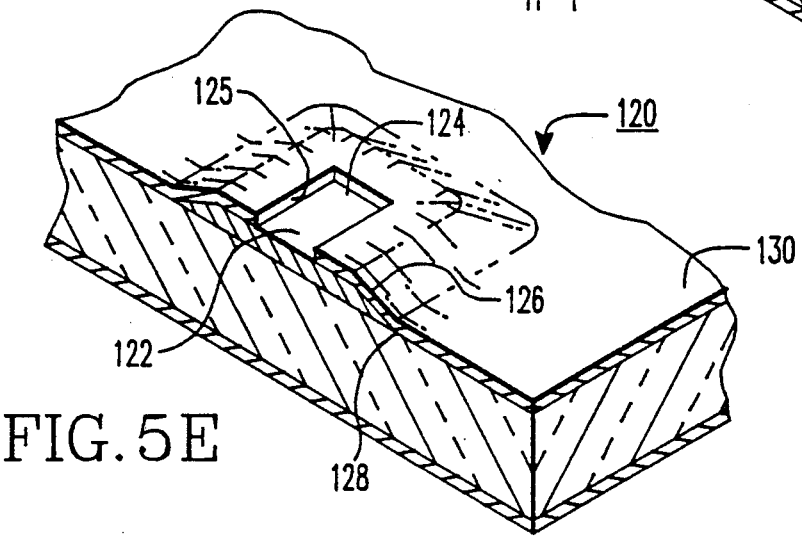
Figure 5F:
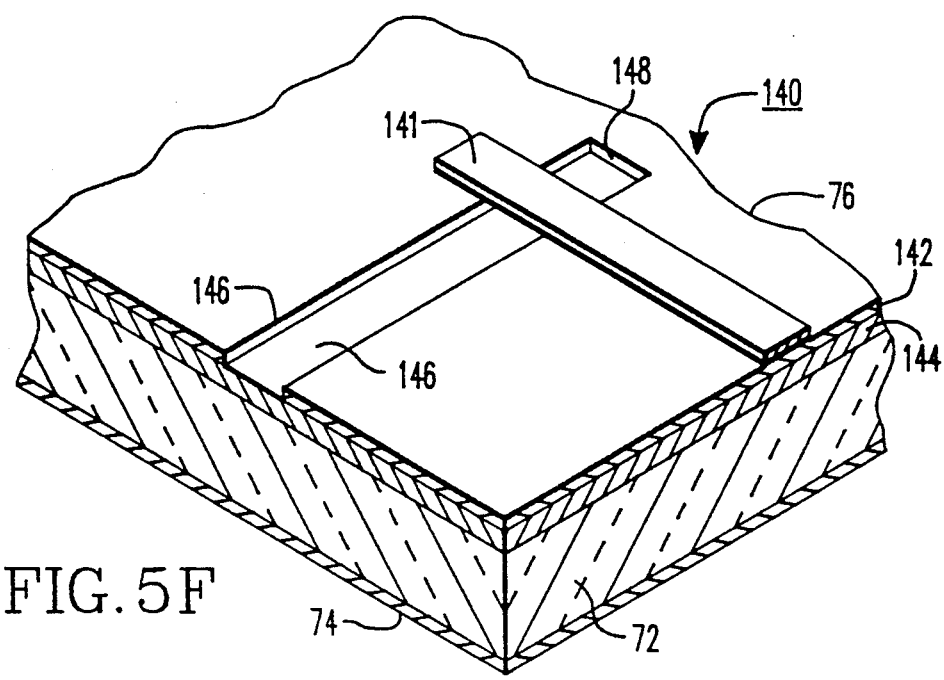

In FIG. 5E the resonator 120 has a tapered YIG film 122 in the unmetallized area 124. The untrapped waves are attenuated in the region of the taper 126 formed at the marginal edges 128 of the YIG film 122 below the ground plane 130 where the wavenumber increases and the group velocity decreases as the YIG film becomes thinner. The untrapped higher order modes are not reflected from the edges 125 of the aperture 124 formed by the metallized region 130.

In delay line filters, signals are reflected from edges of the YIG strip itself which are parallel to the transducers and are used to shape the pass band through interference with the forward launched MSW. In the mode trapped delay line 140 in FIG. 5F an input wave is supplied by a multilayer transducer 141. Reflections from the upper ground plane 142 shape the passband rather than the boundaries of the YIG film 144. The result is that additional higher order width mode attenuation of about 6 dB is obtained since the YIG boundary would reflect all modes equally. In accordance with the invention, the use of a reflected signal from the delay line edges 146 or the end 148 would now be more predictable for different film thicknesses and would likely yield a cleaner passband since the reflected MSW would not be affected by the internal field inhomogeneity at the YIG 144 strip edge.

Figure 6A:
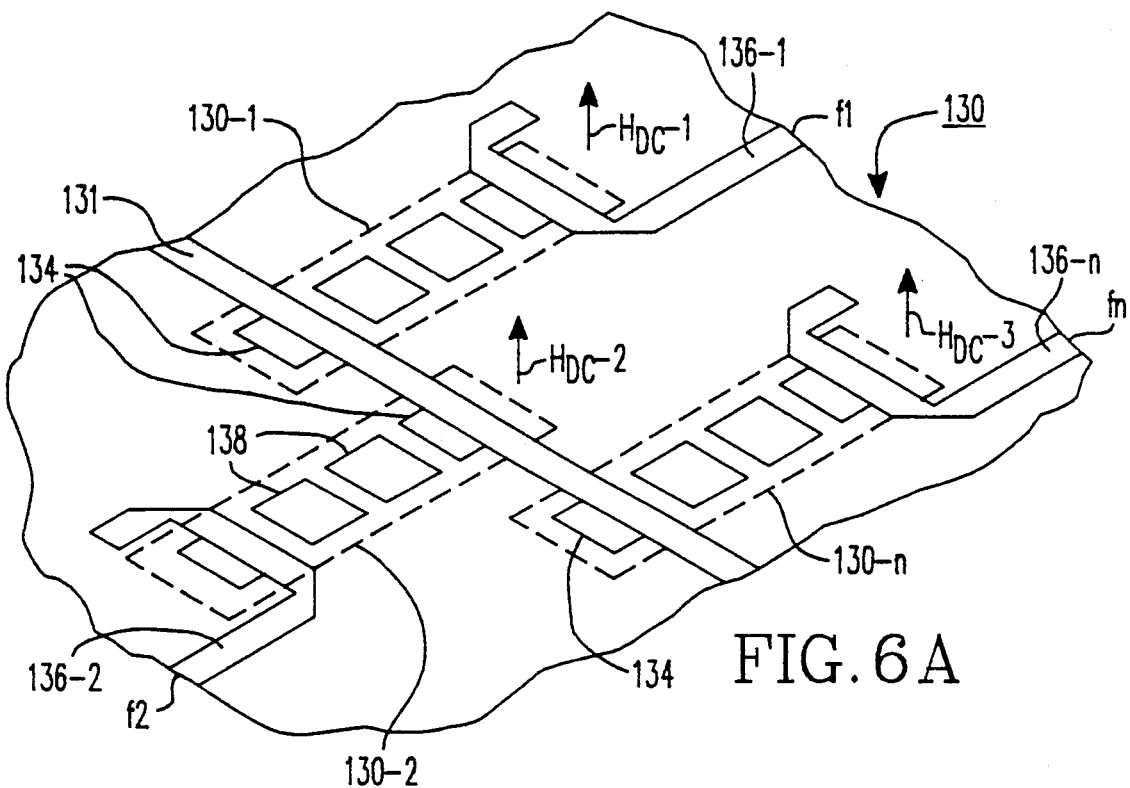
FIGS. 6A–6B are schematic illustrations of multi-channel MSW devices in accordance with the present invention.
Figure 6B:
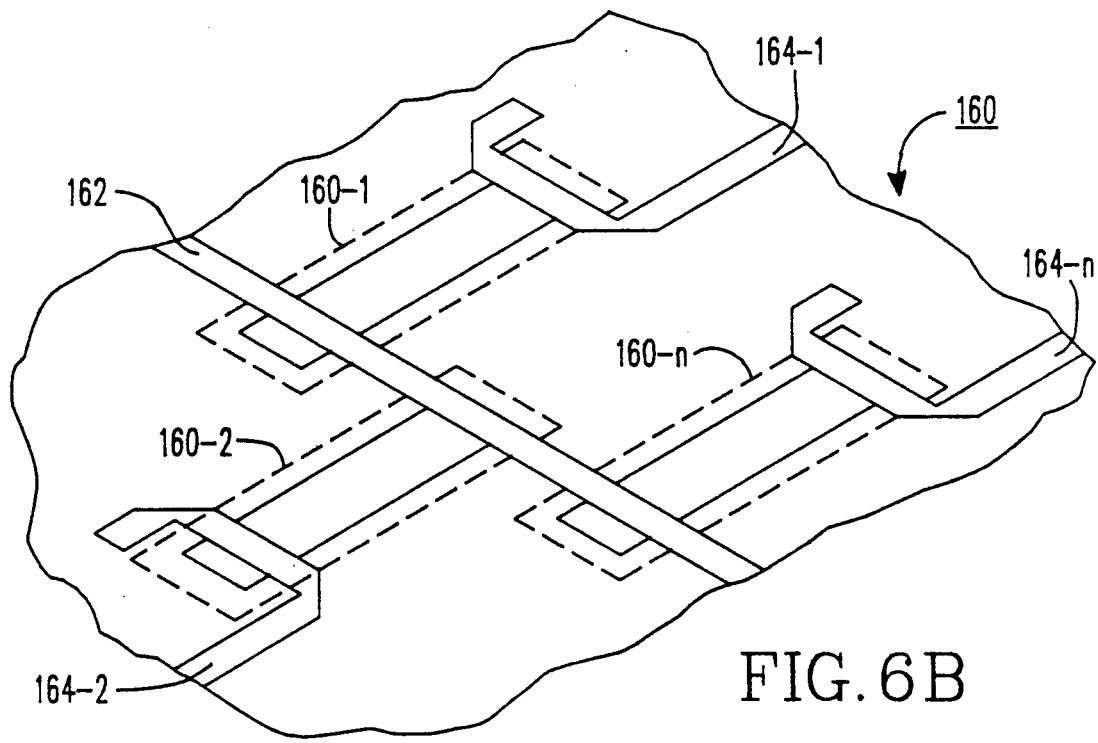

FIGS. 6A and 6B illustrate respectively MSW channelizers 130 and 160 for n-channel filter bank configurations utilizing corresponding trapped mode multistage resonators 130-1 . . . 130-n and delay lines 160-1 . . . 160-n. The structure of the channels 130 and 160 may be similar to the arrangements of FIGS. 5A-5F. In FIG. 6A a common input transducer 131 for each resonator 130-1 . . . 130-n supplies an RF input. A magnetic bias field $H_{dc}1$ . . . $H_{dc}\text{-}n$ for each resonator 130-1 . . . 130-n is necessary to tune each respective channel 1-n to a different frequency. In FIG. 6A, output transducers 136-1-136-n deliver output signals at different frequencies f1-fn in accordance with the filter passbands. The number of resonator stages 138 for each resonator determines the frequency selectivity of a particular channel. The spacing of the resonator stages 138 and the number thereof controls the coupling and thus energy transfer whereby frequency selectivity is increased.

FIG. 6B illustrates delay line filter channelizer 160 formed by delay lines 160-1 . . . 160-n having common input transducer 162 and separate output transducers 164-1 . . . 164-n for the respective delay lines 160-1 . . . 160-n. The principle of operation is similar to previously described arrangements and will not be further detailed.

While the invention has been described in connection with specific embodiments thereof, it will be understood that it is capable of further modifications. This application is intended to cover any variations, uses or adaptations of the invention following, in general, the principles of the invention, and including such departures from the present disclosure as come within known and customary practice within the art to which the invention pertains.

What is claimed is:

1. A magnetostatic wave filter responsive to multimode RF signals launched therein comprising:
   a MSW propagation medium for supporting propagation of MSWs therein formed of a planar ferrite member and having opposed ground planes on opposite faces of said ferrite member, said MSW propagation medium having a region of relatively high attenuation for MSWs and a region of relatively low attenuation for MSWs;
   a plurality of mode trapping means disposed in the region of low attenuation for selectively trapping a corresponding desired MSW mode of the multimode MSWs for propagating in the region of low attenuation and rendering other modes thereof untrapped such that the corresponding desired MSW mode propagating in the region of low attenuation is attenuated less than the untrapped modes propagating in the region of high attenuation; and
   an RF input transducer magnetically coupled to at least one face of the medium and for coupling the RF signals to the ferrite and at least one RF output transducer magnetically coupled to the medium for coupling MSWs in the medium to the RF output, said input transducer comprising a common manifold for coupling in parallel each of said mode trapping means.

2. The MSW filter of claim 1 wherein the output transducer is positioned at the output of each mode trapping means.

3. A method for filtering multimode MSW signals comprising the steps of:
   providing a MSW propagation medium having areas of relatively high and relatively low attenuation for MSWs;
   locating the relatively high attenuation region so as to substantially encompass the low attenuation region;
   providing a trap for at least one lower order mode of the MSW signal in the area of low attenuation;
   locating the trap in the area of low attenuation; and
   attenuating other higher order propagation modes of the signal in the area of high attenuation.

4. A magnetostatic wave (MSW) filter responsive to multimode input signals launched therein comprising:
   a MSW propagation medium for supporting propagation of MSWs therein formed of a planar ferrite member and opposed ground planes on opposite faces of said ferrite member, said MSW propagation medium having a region of relatively high attenuation for MSWs and a region of relatively low attenuation for MSWs; and
   at least one mode trapping means disposed in the region of low attenuation for selectively trapping a desired MSW mode of the multimode MSWs for propagating in said region of low attenuation and rendering other modes thereof untrapped such that the desired MSW mode propagating in the region of low attenuation is attenuated less than the untrapped modes propagating in the region of high attenuation.

5. The MSW filter of claim 4 wherein the mode trapping means is formed of an aperture in at least one of the ground planes in the region of low attenuation.

6. The MSW filter of claim 4 wherein the ferrite is a YIG layer.

7. The MSW filter of claim 6 wherein a portion of the YIG layer includes a lossy area in the region of the high attenuation.

8. The MSW filter of claim 4 wherein the ferrite further includes a layer of lossy YIG in the region of high attenuation.

9. The MSW filter of claim 4 wherein the ferrite includes the a layer of YIG having a bevelled marginal edge portion in the region of high attenuation.

10. The MSW filter of claim 4 wherein the ground plane is a resistive element and has an aperture in the region of low attenuation surrounded by said resistive element.

11. The MSW filter of claim 4 wherein the multimode input signals are RF signals and further including an RF input transducer magnetically coupled to at least one face of the medium for coupling the RF signals to the ferrite and at least one RF output transducer magnetically coupled to the medium for coupling MSWs in the medium to an RF output.

12. The MSW filter of claim 4 further including biasing means for establishing the region of low attenuation.

13. THe MSW filter of claim 4 further including magnetic biasing means for establishing a selected magnetic field in the ferrite to thereby establish a corresponding frequency response of a filter.

14. The MSW filter of claim 4 wherein the mode trapping means comprises a portion of the ground plane having an aperture therein in confronting relationship with a face of the ferrite and the ground plane in confronting relation with an opposite face of the ferrite.

15. The MSW filter of claim 14 wherein the apertured ground plane includes a region of relatively low resistivity surrounding the aperture and a region of relatively high resistivity in the region of high attenuation.

16. The MSW filter of claim 14 further including biasing means for establishing a magnetic field in the ferrite for thereby establishing a selected frequency response of the filter, said biasing means being located in a region aligned with the aperture in the ground plane for establishing the region of low attenuation.

17. The MSW filter of claim 4 wherein the region of high attenuation is an Ho:YIG film.

18. The MSW filter of claim 4 wherein the region of high attenuation is a lossy YIG film.

19. The MSW filter of claim 14 wherein the aperture is in the form of an elongated slot effecting a delay in teh MSWs trapped therein.

20. The MSW filter of claim 14 wherein the aperture is a resonant cavity for trapped MSWs.

21. A magnetostatic wave filter comprising:
an MSW propagation medium for carrying multimode MSWs, said medium having a portion with relatively high attenuation for MSWs and a portion without significant attenuation for MSWs, said portion with high attenuation substantially encompassing the region without significant attenuation;
means for selectively trapping a desired MSW mode disposed in the portion of the mediu mwithout significant attenuation and rendering other MSW modes untrapped therein; and
means disposed in the region of high attenuation for attenuation untrapped modes propagating in the medium such that trapped mode is preserved and untrapped modes are attenuated.

* * * * *